US009096937B2

(12) United States Patent
Gu et al.

(10) Patent No.: US 9,096,937 B2
(45) Date of Patent: Aug. 4, 2015

(54) METHOD FOR ETCHING FILM HAVING TRANSITION METAL

(71) Applicants: TOKYO ELECTRON LIMITED, Tokyo (JP); TOHOKU UNIVERSITY, Miyagi (JP)

(72) Inventors: Xun Gu, Miyagi (JP); Seiji Samukawa, Miyagi (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/222,801

(22) Filed: Mar. 24, 2014

(65) Prior Publication Data

US 2014/0291288 A1  Oct. 2, 2014

(30) Foreign Application Priority Data

Mar. 26, 2013  (JP) ................................. 2013-064372
Jan. 15, 2014  (JP) ................................. 2014-005194

(51) Int. Cl.
*H01L 21/302* (2006.01)
*C23F 4/00* (2006.01)
*H01L 21/3065* (2006.01)
*C23F 1/12* (2006.01)

(52) U.S. Cl.
CPC .............. *C23F 4/00* (2013.01); *H01L 21/3065* (2013.01); *C23F 1/12* (2013.01)

(58) Field of Classification Search
CPC ................ C23F 1/12; C23F 1/16; C23F 1/38; C23F 1/40; H01L 21/3065; H01L 21/32136; H01L 21/02071

USPC ......... 438/706, 708, 709, 710, 712, 713, 714, 438/723, 720, 751; 216/58, 66, 67
See application file for complete search history.

(56) References Cited

U.S. PATENT DOCUMENTS

| 8,591,752 | B2 * | 11/2013 | Abe et al. .................. 216/22 |
| 8,715,520 | B2 * | 5/2014 | Sone et al. ................. 216/75 |
| 8,728,946 | B1 * | 5/2014 | Abe et al. .................. 438/706 |
| 2005/0250338 | A1 * | 11/2005 | Ohmi et al. .................. 438/726 |
| 2011/0065622 | A1 * | 3/2011 | Lee et al. .................. 510/176 |

FOREIGN PATENT DOCUMENTS

JP  2001-319923 A  11/2001
JP  2003-282844 A  10/2003
(Continued)

*Primary Examiner* — Lan Vinh
(74) *Attorney, Agent, or Firm* — Rothwell, Figg, Ernst & Manbeck, P.C.

(57) ABSTRACT

Provided is a method of etching a transition metal-containing film using a substrate processing apparatus. The substrate processing apparatus includes: a processing container configured to define a processing chamber and a plasma generation chamber; and a shielding unit provided between the processing chamber and the plasma generation chamber and formed with a plurality of openings to communicate the processing chamber and the plasma generation chamber with each other. The shielding unit has a shielding property against ultraviolet rays. The method includes: supplying neutral particles of oxygen atoms to the processing chamber in which a workpiece is accommodated by generating plasma of a first gas containing oxygen in the plasma generation chamber; supplying a second gas to complex a transition metal oxidized while supplying the neutral particles of oxygen to the processing chamber; and supplying neutral particles of rare gas atoms to the processing chamber by generating plasma of a rare gas.

10 Claims, 7 Drawing Sheets

(56) References Cited

FOREIGN PATENT DOCUMENTS

| | | |
|---|---|---|
| JP | 2005-236144 A | 9/2005 |
| JP | 2005-294516 A | 10/2005 |
| JP | 2006-501651 A | 1/2006 |
| JP | 2009-43975 A | 2/2009 |
| KR | 10-0842764 B1 | 7/2008 |
| WO | 2004/030049 A2 | 4/2004 |

* cited by examiner

METHOD FOR ETCHING FILM HAVING TRANSITION METAL

CROSS-REFERENCE TO RELATED APPLICATIONS

This application is based on and claims priority from Japanese Patent Applications Nos. 2013-064372 and 2014-005194, filed on Mar. 26, 2013 and Jan. 15, 2014, respectively, with the Japan Patent Office, the disclosures of which are incorporated herein in their entireties by reference.

TECHNICAL FIELD

The present disclosure relates to a method of etching a film including a transition metal ("transition metal-containing film").

BACKGROUND

In manufacturing an electronic device, a processing of etching a layer to be etched on a workpiece to be processed ("workpiece") is performed so as to form a pattern on the etched layer of the workpiece. Attempts to etch a transition metal-containing film as an etched layer are performed recently. Such a film may be used as a film that constitutes a part of, for example, a magnetic tunnel junction (MTJ).

As for etching a film including a transition metal, an Ar ion milling method is usually used. However, the Ar ion milling method is difficult to perform fine machining and may also cause a problem in that etching products may be re-attached to a workpiece. For this reason, a transition metal-containing film is also etched by a plasma etching using a halogen gas. Such a technology is disclosed in, for example, Japanese Patent Laid-Open Publication No. 2003-282844.

SUMMARY

According to an aspect of the present disclosure, there is provided a method of etching a transition metal-containing film using a substrate processing apparatus. The substrate processing apparatus includes a processing container configured to define a processing chamber and a plasma generation chamber, and a shielding unit provided between the processing chamber and the plasma generation chamber and formed with a plurality of openings to communicate the processing chamber and the plasma generation chamber with each other. The shielding unit has a shielding property against ultraviolet (UV) rays. The method includes: supplying neutral particles of oxygen atoms to the processing chamber in which a workpiece is accommodated by generating plasma of a first gas containing oxygen in the plasma generation chamber; supplying a second gas to complex a transition metal oxidized while supplying the neutral particles of oxygen to the processing chamber; and supplying neutral particles of rare gas atoms to the processing chamber by generating plasma of a rare gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
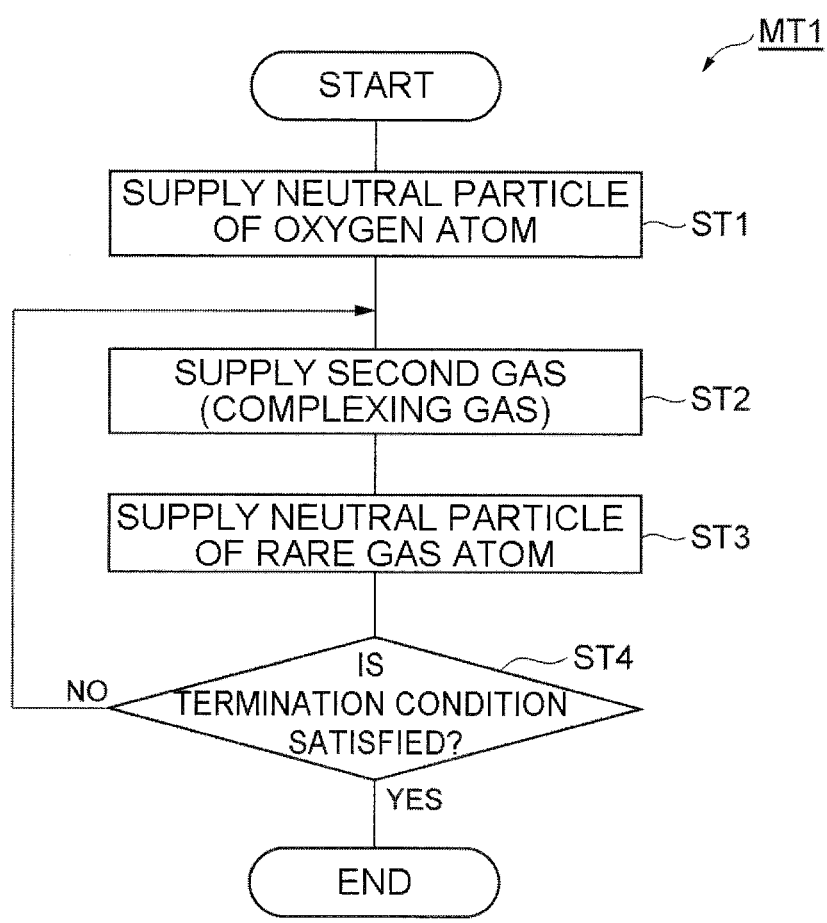
FIG. 1 is a flowchart of a method of etching a film including a transition metal ("transition metal-containing film") in accordance with an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In plasma etching using a halogen gas, it is required to perform the etching under a high temperature environment so as to facilitate a reaction between a transition metal and a halogen element, and in addition so as to evaporate and exhaust an etching product, i.e. a halide. However, when the plasma etching is performed under the high temperature, a device to be manufactured may be damaged.

Accordingly, what is requested in the art is to provide a method of etching a transition metal-containing film at a low temperature.

According to an aspect of the present disclosure, there is provided a method of etching a transition metal-containing film using a substrate processing apparatus. The substrate processing apparatus includes a processing container configured to define a processing chamber and a plasma generation chamber, and a shielding unit provided between the processing chamber and the plasma generation chamber and formed with a plurality of openings to communicate the processing chamber and the plasma generation chamber with each other. The shielding unit has a shielding property against ultraviolet (UV) rays. The method includes: (a) supplying neutral particles of oxygen atoms to the processing chamber in which a workpiece is accommodated by generating plasma of a first gas containing oxygen in the plasma generation chamber; (b) supplying a second gas to complex a transition metal oxidized while supplying the neutral particles of oxygen to the processing chamber; and (c) supplying neutral particles of rare gas atoms to the processing chamber by generating plasma of a rare gas. In an exemplary embodiment, the second gas may include a hydroxyl acid or a carboxylic acid. In another exemplary embodiment, the second gas may include ethanol.

In the method according to the aspect described above, when the neutral particles of the oxygen atoms are irradiated to the transition metal-containing film, the transition metal may be oxidized. Further, when the oxidized transition metal is complexed and the neutral particles of the rare gas atoms are irradiated to complexes, the complexes may be removed at a low temperature. Thus, according to the present disclosure, the transition metal-containing film may be etched at a low temperature.

In an exemplary embodiment, step (b) and step (c) may be performed simultaneously. According to this exemplary embodiment, since complexing of the transition metal and removable of complexes may be performed simultaneously, a throughput may be improved and a time required for etching a thick transition metal-containing film may be shortened. Further, in another exemplary embodiment, all steps (a) to (c) may be performed simultaneously. According to this exemplary embodiment, the throughput may be further improved. In a still another exemplary embodiment, a cycle including at least steps (b) and (c) may be repeated. When the cycle including steps (b) and (c) is repeated, a thick transition metal-containing film may be etched. In addition, step (a) may be included in the cycle.

As described above, a method of etching a transition metal-containing film is provided.

Hereinafter, several exemplary embodiments will be described in detail with reference to accompanying drawings. In addition, in each drawing, like components will be assigned like reference numerals.

FIG. 1 is a flowchart illustrating a method of etching a film including a transition metal ("transition metal-containing film") according to an exemplary embodiment. As illustrated in FIG. 1, the method of etching a transition metal containing material MT1 includes step ST1 to step ST3. As step ST1, neutral particles of oxygen atoms are supplied to a processing chamber in which a workpiece having a transition metal-containing film is accommodated. As a result, the transition metal-containing film is oxidized. Subsequently, at step ST2, a second gas is supplied to the processing chamber. The second gas is a gas for forming complexes from the oxidized transition metal-containing film, i.e. a complexing gas. Subsequently, at step ST3, neutral particles of rare gas atoms are supplied to the processing chamber. At step ST3, the formed metal complexes are removed. As a result, the transition metal-containing film is etched.

In an exemplary embodiment, at step ST4, it is determined whether a termination condition of the method MT1 is satisfied. For example, it is determined whether a cycle including step ST2 and step ST3 is performed a predetermined number of times. When the termination condition is not satisfied, a processing from step ST2 is repeated. Meanwhile, when the termination condition is satisfied, the method MT1 is terminated. When the cycle is repeated a plurality of times in this manner, a thick film may be etched. In addition, in another exemplary embodiment, a cycle including steps ST1 to ST3 may be repeated a predetermined number of times.

In another exemplary embodiment, step ST2 and step ST3 may be simultaneously performed. In such a case, step ST4 may not be required. When step ST2 and step ST3 are performed simultaneously, a throughput may be improved and a time required for etching a relatively thick film may be shortened. In a still another exemplary embodiment, all steps ST1 to ST3 may be simultaneously performed. According to this exemplary embodiment, the throughput may be further improved.

Figure 2:
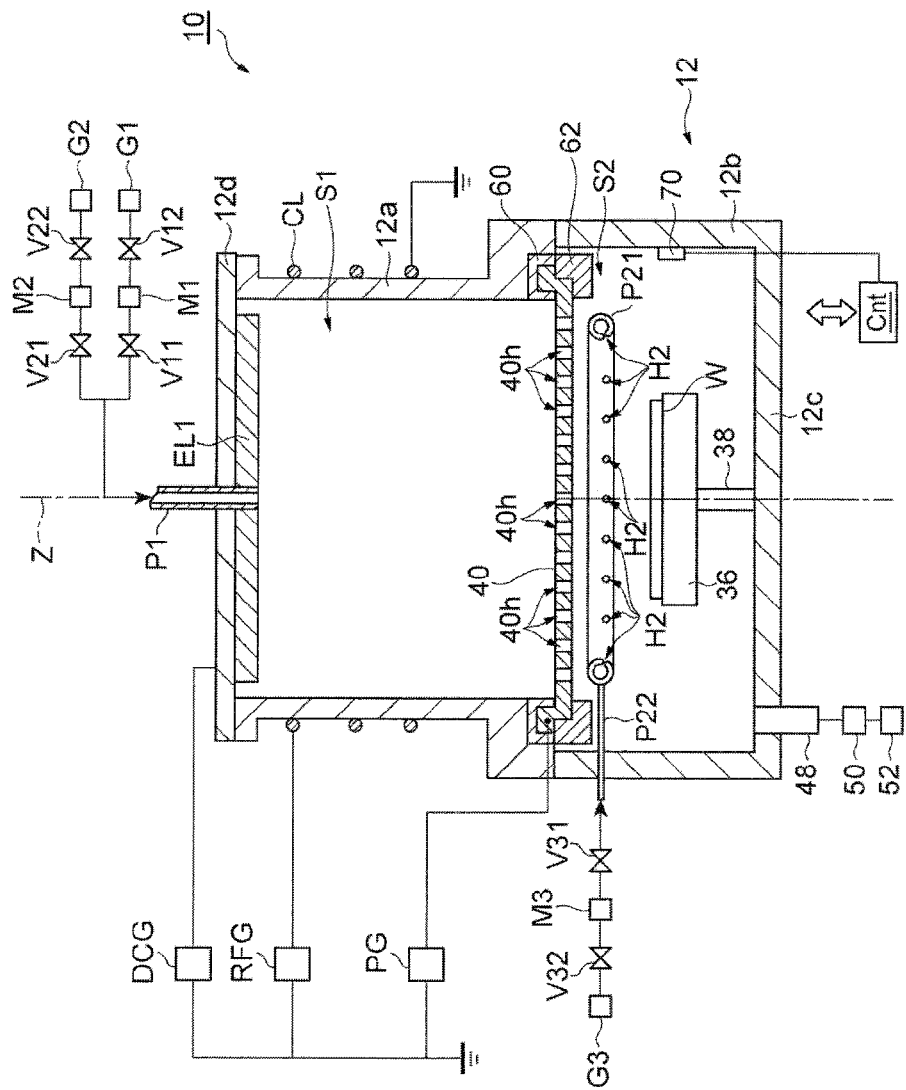
FIG. 2 is a view illustrating an example of the substrate processing apparatus.

Hereinafter, an example of a substrate processing apparatus which may be used for performing the methods according to the above-described exemplary embodiments will be described. FIG. 2 is a view illustrating an exemplary of the substrate processing apparatus. The substrate processing apparatus 10 illustrated in FIG. 2 includes a processing container 12. The processing container 12 is a substantially cylindrical container extending in a direction where an axis Z extends (hereinafter, referred to as a "Z-axis direction") and defines a space therein. The space includes plasma generation chamber S1 and a processing chamber S2 provided below the plasma generation chamber S1.

In an exemplary embodiment, the processing container 12 may include a first side wall 12a, a second side wall 12b, a bottom wall 12c, and a cover unit 12d. These members of the processing container 12 are connected to a ground potential.

The first side wall 12a has a substantially cylindrical shape extending in the Z-axis direction and defines the plasma generation chamber S1. The top end of the first side wall 12a is opened. A cover unit 12d is installed on the first side wall 12a so as to close the opening of the first side wall 12a. In addition, a disc-shaped electrode plate EL is attached to a bottom surface of the cover unit 12d. In the cover unit 12d and the electrode plate EL, a hole is formed along the Z-axis through the cover unit 12d and the electrode plate EL, and a pipe P1 passes through the hole to be connected to the plasma generation chamber S1.

A gas source G1 is connected to the pipe P1 through a valve V11, a flow controller M1 such as a mass flow controller, and a valve V12. In addition, a gas source G2 is connected to the pipe P1 through a valve V21, a flow controller M2 such as a mass flow controller, and a valve V22. The gas source G1 is a source of a gas containing oxygen ("oxygen-containing gas"), for example, a source of $O_2$ gas. In addition, the gas source G2 is a source of a rare gas, for example, a source of Ar gas. In the substrate processing apparatus 10, at least one of the oxygen-containing gas from the gas source G1 and the rare gas of the gas source G2 may be selectively supplied to the plasma generation chamber S1.

A coil CL is wound around the first side wall 12a. One end of the coil CL is connected to a ground and the other end of the coil CL is connected to a high frequency power source RFG. In the substrate processing apparatus 10, when power is supplied to the coil CL from the high frequency power source RFG, an induction magnetic field may be generated within the plasma generation chamber S1. As a result, the gas supplied to the inside of the plasma generation chamber S1 may be exited and plasma may be generated in the inside of the plasma generation chamber S1.

Below the first side wall 12a, the second side wall 12b extends continuously to the first side wall 12a. The second side wall 12b has a substantially cylindrical shape extending in the Z-axis direction and defines the processing chamber S2. The substrate processing apparatus 10 further includes a mounting table 36 within the processing chamber S2. The mounting table 36 may support a workpiece W on a top surface thereof. In an exemplary embodiment, the mounting table 36 is supported by a support member 38 extending from the bottom wall 12c of the processing container 12 in the Z-axis direction. The mounting table 36 may be provided with an attraction holding mechanism such as an electrostatic chuck, a cooling medium flow path connected to a chiller unit, and a temperature control mechanism such as a heater.

Within the processing chamber S2, a pipe P21 extending annularly around the Z-axis is installed above the mounting table 36. The pipe P21 is formed with a plurality of gas jet holes H2 configured to jet gas to the processing chamber S2. A pipe P22 is connected to the pipe P21 in which the pipe P22 extends to the outside of the processing container 12 through the second side wall 12b. A gas source G3 is connected to the pipe P22 through a valve V31, a flow controller M3 such as a mass flow controller, and a valve V32. The gas source G3 is a source of a gas for complexing the oxidized transition metal ("complexing gas"). In the substrate processing apparatus 10, a second gas, i.e. a complexing gas from the gas source G3 may be supplied to the processing chamber S2. The complexing gas supplied by the gas source G3 may include but not exclusively a hydroxyl acid or a carboxylic acid. For example, the complexing gas supplied by the gas source G3 may include ethanol or acetic acid.

In addition, an exhaust tube 48 passes through the bottom wall 12c to be connected to the processing chamber S2. A pressure regulator 50 and a decompression pump 52 are connected to the exhaust tube 48. The pressure regulator 50 and the decompression pump 52 constitute an exhaust apparatus. In the substrate processing apparatus 10, the pressure of the plasma generation chamber S1 and the pressure of the processing chamber S2 may be regulated by operating the pressure regulator 50 and the decompression pump 52 such that a flow rate of the gas supplied to the plasma generation chamber S1 and a flow rate of the gas supplied to the processing chamber S2 are regulated.

In the substrate processing apparatus 10, a shielding unit 40 is installed between the plasma generation chamber S1 and the processing chamber S2. The shielding unit 40 is a substantially disc-shaped member. The shielding unit 40 is formed with a plurality of openings 40h which communicate the plasma generation chamber S1 and the processing chamber S2 with each other.

The shielding unit 40 is supported by, for example, the first side wall 12a. In an exemplary embodiment, the shielding unit 40 is sandwiched between an insulative member 60 and an insulative member 62 and supported on the first side wall 12a via the insulative members 60, 62. Accordingly, in the exemplary embodiment, the shielding unit 40 is electrically separated from the first side wall 12a.

The shielding unit 40 has a shielding property against UV rays generated in the plasma generation chamber S1. That is, the shielding unit 40 may be made of a UV ray impermeable material. In addition, in an exemplary embodiment, when ions generated in the plasma generation chamber S1 are reflected by the inner wall defining the openings 40h to pass the openings 40h, the shielding unit 40 gives electrons to the ions. As a result, the shielding unit 40 neutralizes the ions and discharges the neutralized ions, i.e. neutral particles to the processing chamber S2. In an exemplary embodiment, the shielding unit 40 may be a member made of silicon. In addition, in another exemplary embodiment, the shielding unit 40 may be made of graphite. In a still another exemplary embodiment, the shielding unit 40 may be a member made of aluminum, or a member made of aluminum of which a surface is alumite-processed or provided with an yttrium oxide film.

In an exemplary embodiment, a bias power source PG may be connected to the shielding unit 40 so as to apply a bias power to the shielding unit 40. The bias power source PG may be a high frequency power source configured to generate a high frequency bias power. Alternatively, the bias power source PG may be a direct current (DC) power source. When the power is applied to the shielding unit 40 by the bias power source PG, the ions generated in the plasma generation chamber S1 are accelerated toward the shielding unit 40. As a result, the velocity of the particles that pass through the shielding unit 40 is increased.

In addition, in an exemplary embodiment, a DC power source DCG may be connected to the electrode plate EL. When a DC voltage is applied to the DC power source DCG, the ions generated in the plasma generation chamber S1 may also be accelerated toward the shielding unit 40.

As illustrated in FIG. 2, in an exemplary embodiment, the substrate processing apparatus 10 may further include a control unit Cnt. The control unit Cnt may be a controller such as a programmable computer device. The control unit Cnt may control each component of the substrate processing apparatus 10 according to a program based on a recipe. For example, the control unit Cnt may send a signal to the valves V11, V12 so as to control supply and stopping of supply of the oxygen-containing gas from the gas source G1, and send a control signal to the flow controller M1 so as to control a flow rate of the oxygen-containing gas from the gas source G1. In addition, the control unit Cnt sends a control signal to the valves V21, V22 so as to control supply and stopping of supply of the rare gas from the gas source G2 and send a control signal to the flow controller M2 so as to control a flow rate of the rare gas from the gas source G2. In addition, the control unit Cnt may send a control signal to the valves V31, V32 so as to control supply and stopping supply of the complexing gas from the gas source G3 and may send a control signal to the flow controller M3 so as to control a flow rate of the complexing gas from the gas source G3. In addition, the control unit Cnt may send a control signal to the pressure regulator 50 so as to control an exhaust amount. Further, the control unit Cnt may send a control signal to the high frequency power source RFG so as to adjust the high frequency power, and send a control signal to the bias power PG so as to control supply and stopping supply of a bias power to the shielding unit 40 and to adjust the bias power. Moreover, the control unit Cnt may control the temperature control mechanism of the mounting table 36 to control the temperature of the workpiece W.

In addition, in an exemplary embodiment, the substrate processing apparatus 10 may further include a mass spectrometer QMS 70. The mass spectrometer 70 may be installed within the processing chamber S2. The mass spectrometer 70 detects an amount of complexes or a complexing gas existing within the processing chamber S2 and outputs an output signal representing the amount to the control unit Cnt. Upon receiving the output signal from the mass spectrometer 70, the control unit Cnt detects a change of the amount of the complexes or complexing gas existing within the processing chamber S2 based on the output signal. The control unit Cnt may terminate the performing of the method MT1, for example, when the amount of the complexes decreases. Alternatively, the control unit Cnt may terminate the performing of the method MT1 when the amount of the complexing gas increases. When arriving at an etching end point of a transition metal-containing film, the amount of the complexes existing within the processing chamber S2 is reduced and since the complexing gas is not consumed by etching, the amount of the complexing gas is increased. Accordingly, it is possible to detect the etching end point of the transition metal-containing film by using the output signal of the mass spectrometer 70.

Figure 3A:
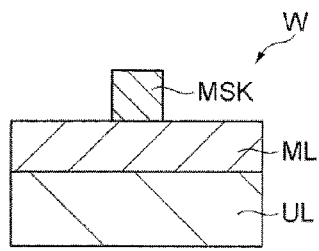
FIGS. 3A to 3F are views for describing each of the steps of the method illustrated in FIG. 1.

Hereinafter, the method MT1 according to an exemplary embodiment will be described in more detail with reference to FIGS. 1 and 2 and FIGS. 3A to 3F. FIGS. 3A to 3F are views for describing each of the steps of the method illustrated in FIG. 1. In the method MT1, a workpiece W is accommodated in the processing chamber S2 first and placed on the mounting table 36. Here, as illustrated in FIG. 3A, it is assumed that the workpiece W includes an under layer UL and a transition metal-containing film ML. The transition metal-containing film ML is provided on the under layer UL. On the transition metal-containing film ML, a mask MSK is installed. The transition metal of the transition metal-containing film ML may be, for example, Ta (tantalum), Ru (ruthenium), Pt (platinum), Pd (palladium), Co (cobalt), or Fe (iron). In addition, a metal that forms the transition metal-containing film ML may be an alloy such as, for example, CoFeB (cobalt iron boron), PtMn (platinum manganese), IrMn (iridium manganese), FePt (iron platinum), FePd (iron palladium), or TbFeCo (terbium iron cobalt). In addition, the mask MSK may be made of, for example, Ta and TiN (titanium nitride). In an exemplary embodiment, the mask MSK may be made of a nitride film such as SiN, TiN, or TaN. The nitride film has a property resistant to oxidization against neutral particles of oxygen. Accordingly, when the mask MSK is made of the nitride film, the oxidization of the mask MSK may be suppressed and as a result, the etching of the mask MSK may be suppressed. That is, a selection ratio in etching of the film ML with respect to the mask MSK may be improved.

Figure 3D:
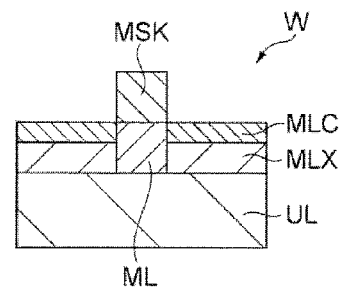
Figure 3B:
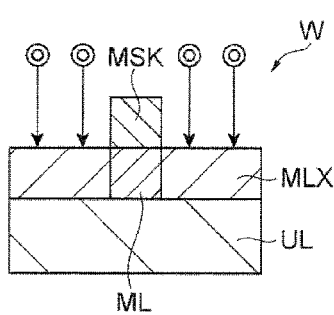

Subsequently, in the method MT1, at step ST1, neutral particles of oxygen atoms are supplied to the processing chamber S2. When performing the method MT1 using the substrate processing apparatus 10, the oxygen-containing gas from the gas source G1 is supplied to the plasma generation chamber S1, and the high frequency power from the high frequency power source RFG is applied to the coil CL. As a result, plasma of the oxygen-containing gas is generated in the plasma generation chamber S1. When oxygen active species in the plasma, for example, ions, pass through the shielding unit 40, the active species is neutralized, and the neutral particles of oxygen atoms are supplied to the processing chamber S2. In addition, at step ST1, as illustrated in FIG. 3B, the neutral particles of oxygen atoms (indicated by "O" enclosed by a circle in the drawing) are irradiated to the surface of the workpiece W, the transition metal at a portion of the film uncovered by the mask MSK is oxidized, and the portion is changed to a film MLX containing the oxidized transition metal. Like this, in the method MT1, at step ST1, neutral particles of oxygen atoms rather than oxygen active species may be irradiated to the film ML, thereby oxidizing the film ML. That is, the film ML may be oxidized by the neutral particles of oxygen atoms having kinetic energy, and at step ST1, it is not required to heat the workpiece W. In addition, when performing step ST1, the temperature of the workpiece W is set to, for example, −30° C.

Figure 3E:
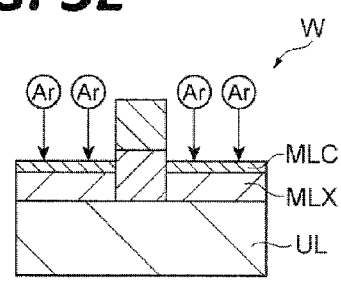
Figure 3C:
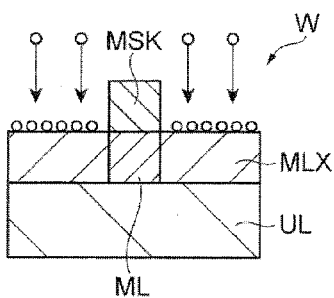
Figure 3F:
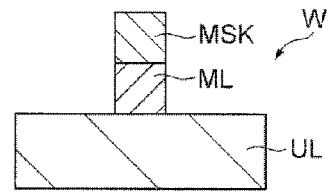

Subsequently, in the method MT1, the supply of the oxygen-containing gas from the gas source G1 to the plasma generation chamber S1 and the generation of the plasma in the plasma generation chamber S1 are stopped and step ST2 is continuously performed. At step ST2, the complexing gas from the gas source G3 is supplied to the processing chamber S2. At step ST2, as illustrated in FIG. 3C, molecules included in the complexing gas are radiated and adsorbed to the film MLX. As a result, complexes are formed from the molecules included in the film MLX, and thus, as illustrated in FIG. 3D, the film MLX is changed to the film MLC in a predetermined range of thickness from the surface. At step ST2, it is also possible to complex the transition metal included in the film MLX without heating the workpiece W. When performing step ST2, the temperature of the workpiece W is set to, for example, −30° C. As step ST2, in some cases, the molecules included in the complexing gas may be adsorbed to the surface of the film MLX and a complex reaction may not occur. In such a case, the kinetic energy of the neutral particles of rare gas atoms supplied at step ST3 to be described later facilitate the complex reaction to form complexes. Whether complexes are formed at step ST2 or step ST3 depends on whether the complexing gas and the film MLX are easily reacted with each other or not.

In addition, in the method MT1, step ST3 is performed. At step ST3, neutral particles of rare gas atoms are supplied to the processing chamber S2. When the MT1 is performed using the substrate processing apparatus 10, a rare gas is supplied from the gas source G2 to the plasma generation chamber S1, a high frequency power is applied from the high frequency power source RFG to the coil CL. As a result, plasma of the rare gas is generated in the plasma generation chamber S1. When active species of rare gas atoms in the plasma, for example, ions pass through the shielding unit 40, the active species are neutralized and neutral particles of the rare gas atoms are supplied to the processing chamber S2. At step ST3, as illustrated in FIG. 3E, the neutral particles of the rare gas atoms (indicated by "Ar" enclosed by circle) are irradiated to the surface of the workpiece W and complexes at a portion of the film MLC uncovered by the mask MSK are removed. As a result, in the method MT1, etching of the transition metal-containing film ML proceeds. At step ST3, it is also possible to remove the film MLC by the neutral particles of rare gas atoms having kinetic energy and it is not necessary to heat the workpiece W. In addition, when performing step ST3, the temperature of the workpiece W is set to, for example, −30° C. Accordingly, in the method MT1, it is possible to etch the transition metal-containing film ML at a low temperature. Further, when the molecules in the complexing gas are adsorbed to the film MLX and thus, a complex reaction does not occur at step ST2, the kinetic energy of the neutral particles facilitate the complex reaction at step ST3, and in addition, formed complexes are removed by the kinetic energy of the neutral particles.

As described above, in an exemplary embodiment, a cycle including step ST2 and step ST3 may be repeated. This is because the complexing at step ST2 or at step ST3 may arrive at only a portion from the surface of the film MLX in the thickness direction in some cases. Accordingly, by the cycle including step ST2 and step ST3, a transition metal-containing film ML having a thick film thickness may be etched. In another exemplary embodiment, a cycle including steps ST1 to ST3 may be repeated.

As described above, in another exemplary embodiment, step ST2 and step ST3 may be performed simultaneously. When step ST2 and step ST3 are performed simultaneously, complexing and removal of complexes may simultaneously proceed. As a result, a throughput may be improved and a time required for etching a thick transition metal-containing film ML may be shortened. In still another exemplary embodiment, all steps ST1 to ST3 may be performed simultaneously. As a result, the throughput may be further improved.

Figure 4:
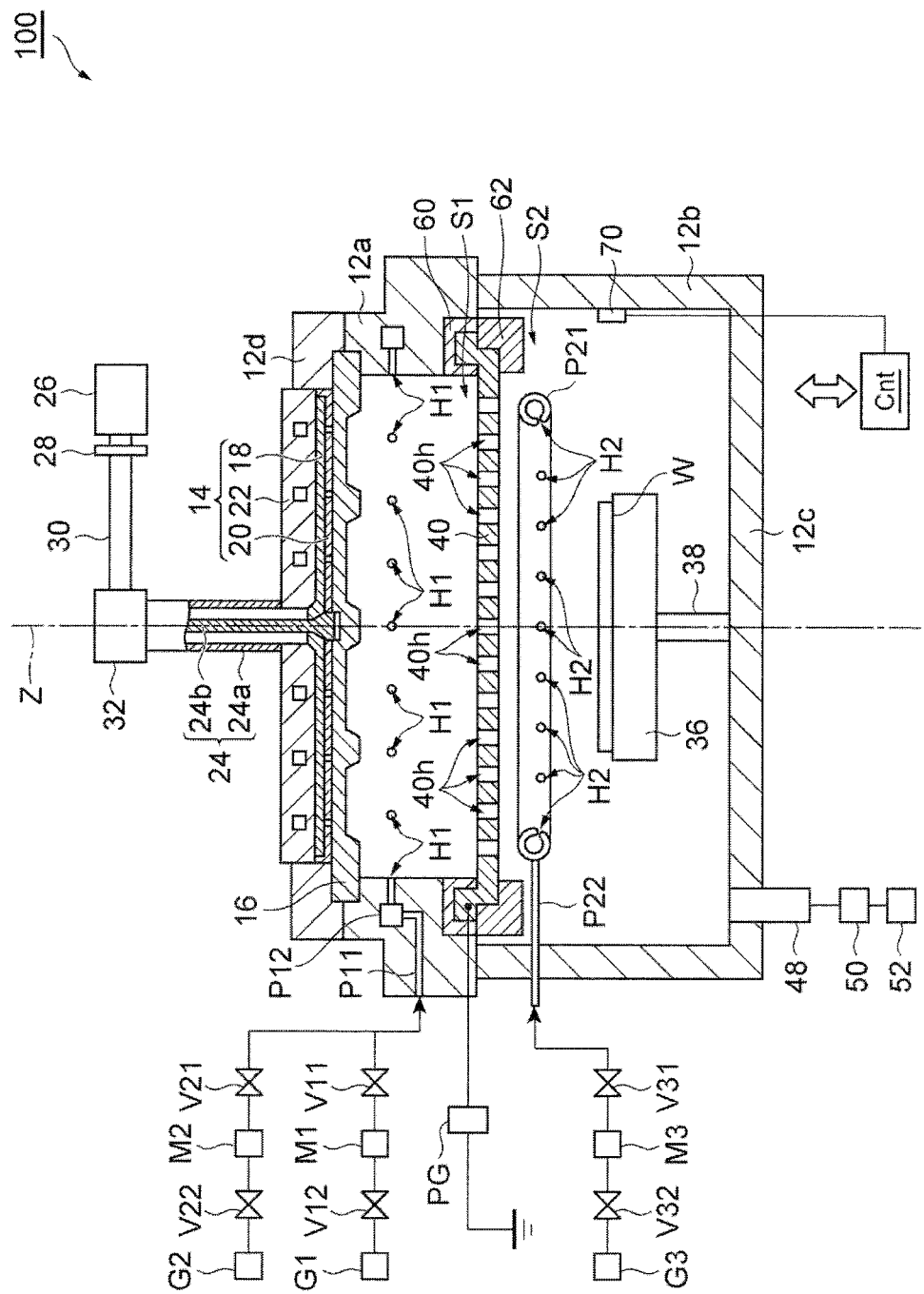
FIG. 4 is a view illustrating another example of the substrate processing apparatus.

Hereinafter, another example of the substrate processing apparatus which may be used in performing the above-described exemplary embodiments will be described. FIG. 4 is a view illustrating another example of the substrate processing apparatus. The substrate processing apparatus 10 described above is provided with an induction coupling type plasma source. However, the plasma source of the apparatus used in performing the methods according to the above-described exemplary embodiments is not limited to the induction coupling type and may be, for example, microwaves. As an example, the substrate processing apparatus 100 illustrated in FIG. 4 uses microwaves as the plasma source and is provided with a so-called radial line slot antenna. Hereinafter, differences between the substrate processing apparatus 100 and the substrate processing apparatus 10 will be described and an overlapping description will be omitted.

In the substrate processing apparatus 100, gas lines P11, P12 are formed in a first side wall 12a. The gas line P11 extends from an outer surface of the first side wall 12a and connected to the gas line P12. The gas line P12 extends in a substantially annular shape around the Z-axis within the first side wall 12a. A plurality of gas jet holes H1 configured to a gas into the plasma generation chamber S1 are connected to the gas line P12.

The gas source G1 described above is connected to the gas line P11 through a valve V11, a flow controller M1, and a valve V12. In addition, the gas source G2 described above is connected to the gas line P11 through a valve V21, a flow controller M2, and a valve V22.

A cover unit 12d installed on the first side wall 12a is provided with an opening and an antenna 14 is installed within the opening. A dielectric window 16 is installed just below the antenna 14 to seal the plasma generation chamber S1.

The antenna 14 supplies microwaves to the plasma generation chamber S1 through the dielectric window 16. In an exemplary embodiment, the antenna 14 may be a radial line slot antenna. The antenna 14 includes a dielectric plate 18 and a slot plate 20. The dielectric plate 18 shortens the wavelength of microwaves and is formed substantially in a disc shape. The dielectric plate 18 may be made of, for example, quartz or alumina. The dielectric plate 18 is sandwiched between the slot plate 20 and a bottom surface of a metallic material of a cooling jacket 22. Accordingly, the antenna 14 may be constituted with the dielectric plate 18, the slot plate 20, and the bottom surface of the cooling jacket 22.

Figure 5:
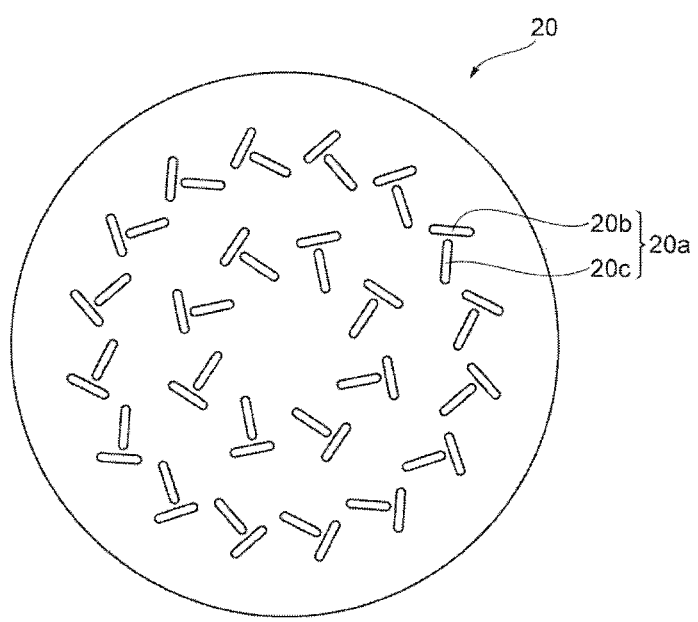
FIG. 5 is a plan view illustrating an example of such a slot plate.

The slot plate 20 is a substantially disc-shaped metal plate which is formed with a plurality of slot pairs. FIG. 5 is a plan view illustrating an example of such a slot plate. The slot plate 20 is formed with a plurality of slot pairs 20a. The plurality of slot pairs 20a are provided at predetermined intervals in the radial direction and also arranged at predetermined intervals in the circumferential direction. Each slot pair 20a includes two slot holes 20b, 20c. The slot hole 20b and the slot hole 20c extend to intersect or meet at right angles.

The substrate processing apparatus 100 may also be provided with a coaxial waveguide 24, a microwave generator 26, a tuner 28, a waveguide 30, and a mode converter 32. The microwave generator 26 generates microwaves having a frequency of 2.45 GHz, for example. In addition, the control unit Cnt of the substrate processing apparatus 100 has a function of controlling the microwave generator 26 instead of the high frequency power source RFG controlling function of the control unit Cnt of the substrate processing apparatus 10. The other functions of the control unit Cnt of the substrate processing apparatus 100 are the same as those of the control unit Cnt of the substrate processing apparatus 10.

The microwave generator 26 is connected to an upper portion of the coaxial waveguide 24 through the tuner 28, the waveguide 30, and the mode converter 32. The coaxial waveguide 24 extends along the Z-axis which is the central axis thereof. The coaxial waveguide 24 includes an outer conductor 24a and an inner conductor 24b. The outer conductor 24a has a cylindrical shape extending around the Z-axis as the center thereof. The lower end of the outer conductor 24a may be electrically connected to an upper portion of the cooling jacket 22 having a conductive surface. The inner conductor 24b is installed inside the outer conductor 24a. The inner conductor 24b is formed substantially in a circular columnar shape extending along the Z-axis. The lower end of the inner conductor 24b is connected to the slot plate 20 of the antenna 14.

In the substrate processing apparatus 100, the microwaves generated by the microwave generator 26 are propagated to the dielectric plate 18 through the coaxial waveguide 24 and applied to the dielectric window 16 through the slot holes of the slot plate 20.

The dielectric window 16 is formed substantially in a disc shape and is made of, for example, quartz or alumina. The dielectric window 16 is installed just below the slot plate 20. The dielectric window 16 transmits the microwaves received from the antenna 14 to be introduced into the plasma generation chamber S1. As a result, an electric field is generated just below the dielectric window 16 such that plasma of the gas supplied to the plasma generation chamber S1 is generated. That is, at step ST1, plasma of an oxygen-containing gas may be generated in the plasma generation chamber S1, and at step ST3, plasma of a rare gas may be generated in the plasma generation chamber S1. In such a substrate processing apparatus 100, it is also possible to perform the exemplary embodiments described above.

Hereinafter, descriptions will be made on several tests which were conducted so as to evaluate the methods according to the above-described exemplary embodiments.

Test Examples 1 to 3 and Comparative
Test Example 1

In Test Examples 1 to 3, a Ta film was oxidized using substrate processing apparatus 10 in order to confirm the effect of step ST1. Specifically, in Test Examples 1 to 3, workpieces, each of which is formed with a Ta film on a silicon substrate in a film thickness of 5.0 nm, were used. In addition, $O_2$ gas of 20 sccm was supplied to the plasma generation chamber S1, the pressure of the plasma generation chamber S1 was set to 6 Pa, the pressure of the processing chamber S2 was set to 0.1 Pa, and a high frequency power of 1600 W was applied to the high frequency power source RFG from the coil CL. Further, the temperature of the workpieces was set to −30° C. In Test Examples 1 to 3, respective lengths of processing time for an oxidization processing (step ST1) were set to 1 minute, 2 minutes, and 8 minutes.

Figure 6:
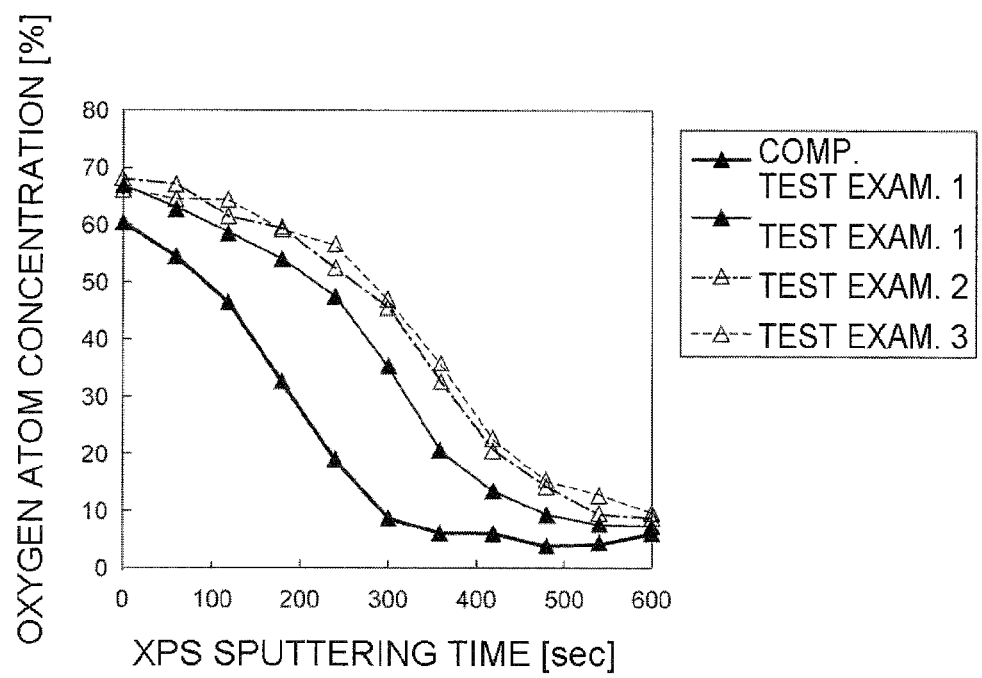
FIG. 6 is a graph representing evaluation results of Test Examples 1 to 3 and Comparative Test Example 1.

The concentrations of oxygen atoms in the Ta films oxidized in the processings of Test Examples 1 to 3 were evaluated by X-ray photoelectron spectroscopy (XPS). Further, using the same workpieces in which the Ta film was naturally oxidized in Comparative Test Example 1, the oxygen atom concentrations included in the Ta films of Comparative Test Example 1 were evaluated by XPS. The results are represented in the graph of FIG. 6. In FIG. 6, the horizontal axis represents an XPS sputtering time which corresponds to a depth from a surface of a film. In addition, the vertical axis represents an oxygen atom concentration. As is clearly shown in FIG. 6, it was found that the Ta films according to Test Examples 1 to 3 were oxidized more deeply that the naturally oxidized films of Comparative Test Example 1. From this, it was found that, according to step ST1, low temperature oxidization is enabled.

Test Example 4 and Comparative Test Example 2

In Test Example 4, a cycle including step ST1 to step ST3 were repeated eight (8) times using the substrate processing apparatus 10 so as to etch Ta films. Specifically, in Test Example 4, workpieces, each of which is formed with a Ta film on a silicon substrate in a film thickness of 5.0 nm, were used. Each process condition in one cycle in Test Example 4 is as follows.

Step ST1

Power of High Frequency Power Source RFG: 1600 W
Pressure of Plasma Generation Chamber S1: 6 Pa
Pressure of Processing Chamber S2: 0.1 Pa
Flow Rate of $O_2$ Gas: 20 sccm
Temperature of Workpiece: −30° C.
Processing Time: 30 sec Step ST2

Pressure of Processing Chamber: 0.8 Pa
Flow Rate of Ethanol Gas: 7 sccm
Temperature of Workpiece: −30° C.
Processing Time: 30 sec Step ST3

Power of High Frequency Power Source RFG: 1600 W
Pressure of Plasma Generation Chamber S1: 42 Pa Pressure of Processing Chamber S2: 0.5 Pa
Flow Rate of Ar Gas: 200 sccm
Temperature of Workpiece: −30° C.
Processing Time: 30 sec In addition, Comparative Test Example 2, which is different from Test Example 4 in that step ST2 is not included in the cycle, was performed. That is, in Comparative Test Example 2, a cycle, in which step ST1 for oxidization is performed on a workpiece which is the same as that of Test Example 4 and subsequently step ST3 is performed without performing step ST, was repeated eight (8) times. Other conditions of the Comparative Test Example 2 are the same as those of Test Example 4.

Figure 7:
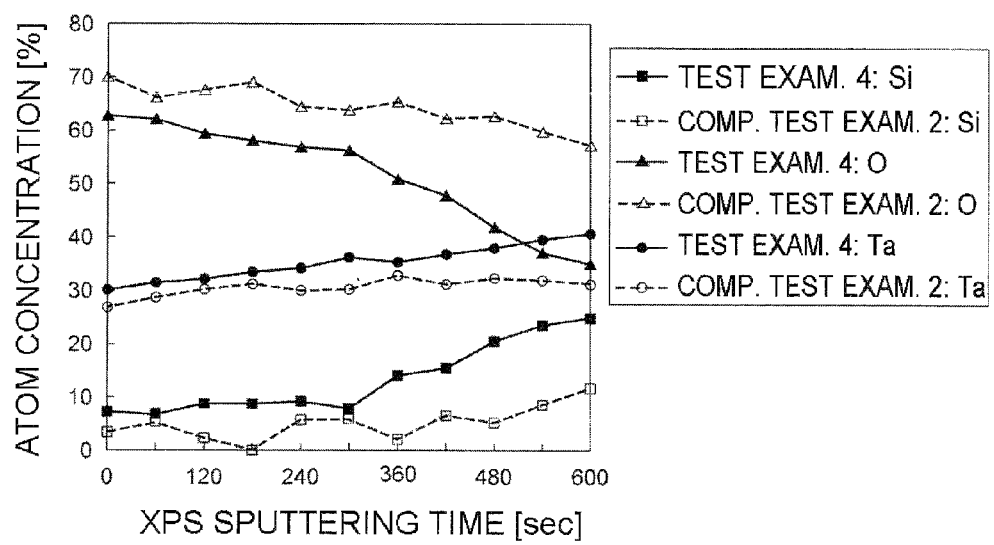
FIG. 7 is a graph representing evaluation results of Test Example 4 and Comparative Test Example 2.

The atom concentrations in the workpieces subjected to the processings of Test Example 4 and Comparative Test Example 2 were evaluated by XPS. The results are represented in a graph of FIG. 7. In FIG. 7, the horizontal axis represents an XPS sputtering time which corresponds to a depth from a surface of a workpiece. In addition, the vertical axis represents an oxygen (O) atom concentration. In FIG. 7, Si atom concentrations, oxygen (O) concentrations, and Ta atom concentrations of Test Example 4 and Comparative Test Example 2 are represented. As is clearly shown in FIG. 7, in the workpieces subjected to the processings of Test Example 4, more Si atoms as the atoms forming an under layer are detected than those in the workpieces subjected to the processings of Comparative Test Example even though the sputtering time in Test Example 4 was shorter than that in Comparative Test Example 2. From this, it was found that as a result of Test Example 4, the Ta films were reduced from the workpieces, that is, the Ta films ware etched.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of etching a transition metal-containing film using a substrate processing apparatus, wherein the substrate processing apparatus comprises:
   a processing container configured to define a processing chamber and a plasma generation chamber; and
   a shielding unit provided between the processing chamber and the plasma generation chamber and formed with a plurality of openings to communicate the processing chamber and the plasma generation chamber with each other, the shielding unit being configured to give an electron to the ions being passed through the openings of the shielding unit, thereby neutralizing the ions, and
   wherein the method comprises:
   supplying neutral particles of oxygen atoms to the processing chamber in which a workpiece is accommodated by generating plasma of a first gas containing oxygen in the plasma generation chamber and passing the generated plasma of the first gas containing oxygen through the openings of the shielding unit, thereby oxidizing the transition metal-containing film;
   supplying a second gas to the processing chamber to complex transition metal in the transition metal-containing film oxidized with the supplying of neutral particles of oxygen atoms to the processing chamber; and
   supplying neutral particles of rare gas atoms to the processing chamber by generating plasma of a rare gas and passing the generated plasma of the rare gas through the openings of the shielding unit, thereby removing complexes formed at the supplying a second gas to the processing chamber.

2. The method of claim 1, wherein the second gas includes a hydroxyl acid or a carboxylic acid.

3. The method of claim 2, wherein the second gas includes ethanol.

4. The method of claim 1, wherein the supplying of the second gas and the supplying of the neutral particles of the rare gas atoms are performed simultaneously.

5. The method of claim 4, wherein the supplying of the neutral particles of the oxygen atoms, the supplying of the second gas, and the supplying of the neutral particles of the rare gas atoms are performed simultaneously.

6. The method of claim 1, wherein a cycle including the supplying of the second gas and the supplying of the neutral particles of the rare gas atoms is repeated.

7. The method of claim 1, the workpiece includes a mask on the film and the mask is made of a nitride film.

8. A method of etching a film containing a transition metal using a substrate processing apparatus, the method comprising:
   providing a processing container in which a processing chamber and a plasma generation chamber are defined; and
   providing a shielding unit between the processing chamber and the plasma generation chamber, the shielding unit being formed with a plurality of openings to communicate the processing chamber and the plasma generation chamber with each other, and configured to give electrons to ions being passed through the openings of the shielding unit, thereby neutralizing the ions;
   supplying neutral particles of oxygen atoms to the processing chamber in which a workpiece is accommodated by generating plasma of a first gas containing oxygen in the plasma generation chamber and passing the generated plasma of the first gas containing oxygen through the openings of the shielding unit, thereby oxidizing the film containing the transition metal;
   supplying a second gas to the processing chamber to complex the transition metal in the film oxidized with the supplying of neutral particles of oxygen atoms to the processing chamber; and
   supplying neutral particles of rare gas atoms to the processing chamber by generating plasma of a rare gas and passing the generated plasma of the rare gas through the openings of the shielding unit, thereby removing complexes formed at the supplying a second gas to the processing chamber.

9. The method of claim 8, wherein the shielding unit is sandwiched between insulative members.

10. The method of claim 8, wherein the shielding unit is made of a UV ray impermeable material.

* * * * *